United States Patent
Weigand et al.

[11] Patent Number: 6,046,503
[45] Date of Patent: *Apr. 4, 2000

[54] METALIZATION SYSTEM HAVING AN ENHANCED THERMAL CONDUCTIVITY

[75] Inventors: Peter Weigand, Unterhaching, Germany; Dirk Tobben, Fishkill, N.Y.

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/938,072

[22] Filed: Sep. 26, 1997

[51] Int. Cl.[7] .......................... H01L 23/48; H01L 23/52; H01L 29/40; H01L 29/00
[52] U.S. Cl. .......................... 257/758; 257/700; 257/632; 257/633; 257/508
[58] Field of Search ..................... 257/508, 758, 257/712, 713, 700, 705, 632, 633, 701

[56] References Cited

U.S. PATENT DOCUMENTS

| | | | |
|---|---|---|---|
| 5,182,632 | 1/1993 | Bechtel et al. | 257/713 |
| 5,391,914 | 2/1995 | Sullivan et al. | 257/635 |
| 5,442,237 | 8/1995 | Hughes et al. | 257/758 |
| 5,448,112 | 9/1995 | Hara | 257/758 |
| 5,744,865 | 4/1998 | Jeng et al. | 257/750 |
| 5,760,429 | 6/1998 | Yano et al. | 257/758 |

OTHER PUBLICATIONS

CRC Handbook of Chemistry and Physics, 77th Edition, David R. Lide, pp. 12–177, 178, 1996.

*Primary Examiner*—Mahshid Saadat
*Assistant Examiner*—Jesse A. Fenty
*Attorney, Agent, or Firm*—Stanton C. Braden

[57] ABSTRACT

A multi-level integrated circuit metalization system having a composite dielectric layer comprising a layer 22 of diamond or sapphire. A plurality of patterned metalization layers is disposed over a semiconductor substrate 10. A composite dielectric layer is disposed between a pair of the metalization layers. The composite dielectric layer 22 comprises a layer of diamond or sapphire. The diamond or sapphire layer has disposed on a surface thereof one of the patterned metalization layers. A conductive via 34 passes through the composite layer. One end of the conductive via is in contact with diamond or sapphire layer. The diamond or sapphire layer conducts heat laterally along from the metalization layer disposed thereon to a heat sink provided by the conductive via. The patterned diamond or sapphire layer provides a mask during the second metalization deposition. Thus, the leads of the next metalization layer will be deposited directly on the diamond or sapphire layer which will serve as an etch stop during the metal etching process.

14 Claims, 4 Drawing Sheets

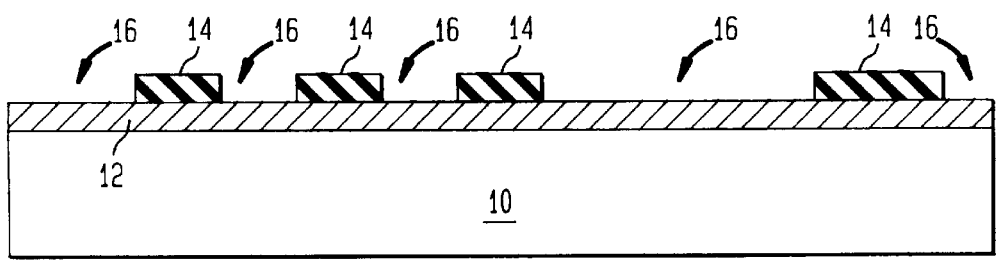
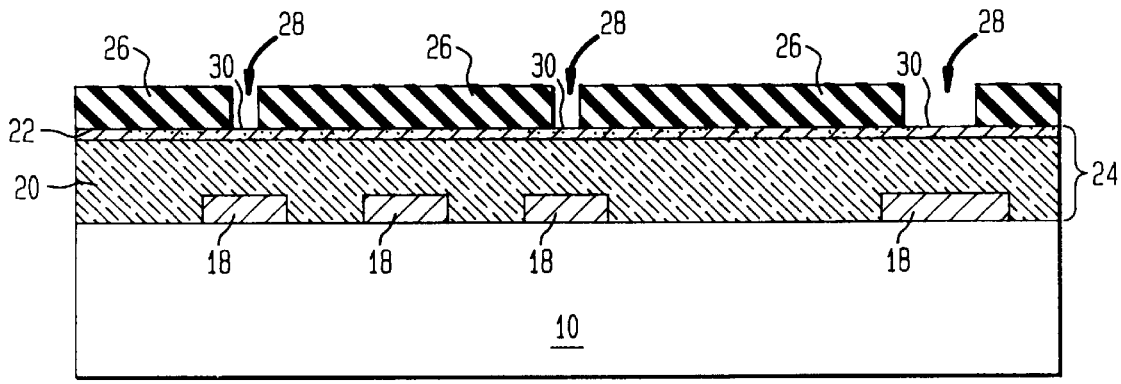

METALIZATION SYSTEM HAVING AN ENHANCED THERMAL CONDUCTIVITY

BACKGROUND OF THE INVENTION

This invention relates generally to metalization systems and more particularly to metalization systems for semiconductor integrated circuits.

As is known in the art, metalization systems in modern integrated circuits typically include multi-level patterns of electrical conductors, or leads separated by a dielectric, typically silicon dioxide. One significant problem which is evolving is the conductance of heat generated in a lead at an upper level to the substrate, typically silicon. The leads in various levels are electrically interconnected by conductive vias which pass through the dielectric between the leads which are to be electrically interconnected. While these conductive vias also provide for the transfer of heat in an upper lead to a lower lead, which heat is then transferred to the more thermally conductive substrate, in some region of the integrated circuit, there are leads which are less proximate to a via. This situation becomes even more significant with low dielectric constant films, such as spin-on glasses, organic polymers or xerogels as the inter-metalization layer dielectric material since their thermal conductivities are at least an order of magnitude smaller than that of plasma enhanced chemical vapor deposition (PECVD) silicon dioxide. For example, plasma enhanced tetraethyl oxosilane (PETEOS) oxide has a thermal conductivities of around 1 W/m°K. Dielectrics such as spin-on-glass, organic polymers and xerogels, have reduced dielectric constants, e.g., less than 3, but their thermal conductivities will also be about an order of magnitude smaller. Thus, while it is desirable to use dielectric materials having low dielectric constants to provide lower capacitance between overlaying metal leads, these lower dielectric constant materials have lower thermal conductivity thereby reducing their effectiveness in conducting heat from a lead which is less proximate to a conductive via to the substrate.

SUMMARY OF THE INVENTION

In accordance with one feature of the invention, a multi-level integrated circuit metalization system is provided having a composite dielectric layer. The composite layer comprises a first dielectric layer and a second dielectric layer. The thermal conductivity of the first layer is at least two orders of magnitude greater than the thermal conductivity of the second one of the layers. In one embodiment, the first layer is either diamond or sapphire.

In accordance with another feature of the invention, a multi-level integrated circuit metalization system is provided having metal leads on different levels separated by a composite dielectric layer. The composite layer comprises a first dielectric layer and a second dielectric layer. The thermal conductivity of the first layer is at least two orders of magnitude greater than the thermal conductivity of the second layer. In one embodiment, the first layer is diamond or sapphire.

In accordance with another feature of the invention, an integrated circuit is provided having composite dielectric layer disposed over a semiconductor substrate. The composite layer comprises a first dielectric layer and a second dielectric layer. The thermal conductivity of the first layer is at least two orders of magnitude greater than the thermal conductivity of the second layer. In one embodiment, the first layer is diamond or sapphire. A metal lead is disposed on the first layer.

In accordance with another feature of the invention, an integrated circuit metalization system is provided wherein a plurality of patterned metalization layers is disposed over a semiconductor substrate. A composite dielectric layer is disposed between a pair of the metalization layers. The composite layer comprising a first dielectric layer and a second dielectric layer, the thermal conductivity of the first layer being at least two orders of magnitude greater than the thermal conductivity of the second layer. In one embodiment, the composite dielectric layer comprises a layer of diamond or a layer of sapphire. The first layer has disposed on a surface thereof one of the patterned metalization layers.

In accordance with another feature of the invention, a conductive via passes through the composite layer. The conductive via is in contact with the first layer.

With such an arrangement, the first layer conducts heat laterally along from the metalization layer disposed thereon to a heat sink provided by the conductive via.

In accordance with another feature of the invention, a method is provided for patterning a metalization layer. The method includes the step of forming a dielectric layer over a semiconductor substrate. A layer of diamond or sapphire is formed on the dielectric layer. A layer of metal is formed on the diamond or sapphire layer. The layer of metal is patterned into electrical conductors.

With such an arrangement, the diamond or sapphire layer serves as to protect the dielectric layer during the metal layer patterning process.

In accordance with another feature of the invention, a method is provided for forming an integrated circuit metalization system. The method includes the step of patterning a first layer of metal into electrical conductors. A dielectric layer is formed on the patterned first metal layer. A diamond or sapphire layer is formed on the dielectric layer. A via is formed through a portion of the diamond or sapphire layer and through an underlying portion of the dielectric layer to expose an underlying portion of one of the electrical conductors patterned in the first layer of metal. A conductor is formed on the diamond or sapphire layer. A portion of the conductor passes through the via and is deposited on said exposed one of the electrical conductors patterned in the first layer of metal. In one embodiment, the portion of the conductor passing through the via is a different material from the portion of the conductor disposed on the diamond or sapphire layer. The conductor is patterned into a plurality of electrical conductors. Heat generated in such electrical conductors is transferred through the diamond or sapphire layer to the portion of the second metal layer passing through the via to the said exposed one of the electrical conductors.

With such an arrangement, the patterned diamond or sapphire layer provides a mask during the second metalization deposition. Further, the leads of the next metalization layer are deposited directly on the diamond or sapphire layer which will serve as an etch stop during the metal etching process.

In accordance with another feature of the invention, a method is provided for patterning a metal layer. The method includes the step of forming a dielectric layer over a substrate. A diamond or sapphire layer is formed on the dielectric layer. A via is formed through a portion of the diamond or sapphire layer into an underlying portion of the dielectric layer and a trench is formed in an upper portion of such dielectric layer. A layer of metal is formed on the diamond or sapphire layer with a portion of the metal layer passing through the via and into the trench formed in the dielectric layer, upper portions of the metal extending above an upper surface of the diamond or sapphire layer. Upper portions of the metal layer are polished to planarize the surface of the metal to the level of the upper surface of the diamond or sapphire layer. Thus, the composite dielectric layer isolates portions of the metal layer into separate conductors.

With such an arrangement, the patterned diamond or sapphire layer provides a mask during the polishing step.

BRIEF DESCRIPTION OF THE DRAWING

These and other features of the invention will become more readily apparent from the following detailed description taken together with the accompanying drawings, in which:

FIGS. 1A through 1G show a metalization system for an integrated circuit at various stages in the manufacture thereof in accordance with the invention.

DETAILED DESCRIPTION

Figure 1C:
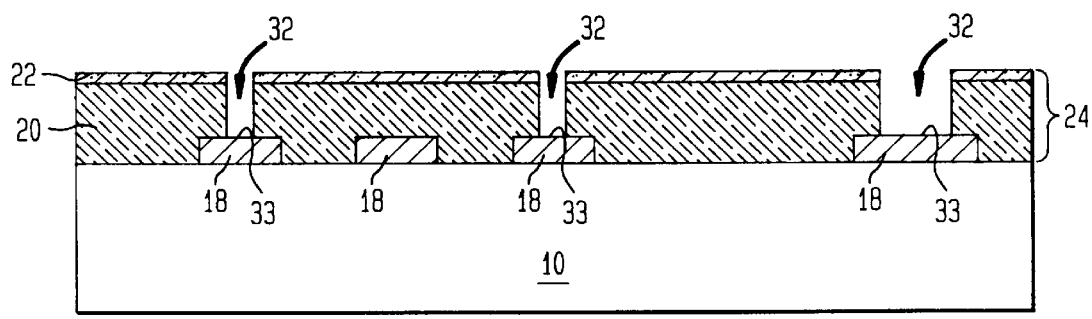

Referring to FIG. 1A, a cross section of an integrated circuit (IC) is shown. Such an IC includes a memory circuit such as a random access memories (RAM), a dynamic RAM (DRAM), a synchronous DRAM (SDRAM), or a static RAM (SRAM). The IC can also be a logic device such as a programmable logic array (PLA), an application specific ICs (ASIC), a merged DRAM-logic circuit, or any circuit.

Typically, numerous ICs are fabricated on a semiconductor substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAs), and other electronic products. As shown, a substrate is provided. The substrate 10, for example, comprises a silicon wafer. Other semiconductor substrates such as gallium arsenide, germanium, silicon on insulator (SOI), or other semiconductor materials are also useful. The substrate, for example, may include various device layers (not shown) formed thereon. The term substrate, as used herein, may include the substrate and the various device layers.

Illustratively, a first metalization layer 12 is formed over the substrate 10 in any conventional manner. A photoresist layer 14 is disposed on the upper surface of the first metalization layer 12 and patterned with windows 16, as shown, using conventional photolithography to expose portions of the first metalization layer 12. After exposure to a suitable etching process, the first metalization layer 12 is patterned into metal conductors 18, as shown in FIG. 1B. The photoresist layer is then removed.

After removal of the photoresist layer 14, a dielectric layer 20, here low K dielectric spin-on-glass or organic dielectric is deposited a over the structure, and planarized, if necessary, as shown in FIG. 1B. Here, for example, the thickness of the dielectric layer is 5000A–15000A, has a dielectric constant of 2.5 to 3 and a thermal conductivity of 0.1 to 0.5 W/m°K. A layer 22, here a thin film, of diamond or sapphire, is formed on the upper surface of the dielectric layer 20. Here, for example, the layer 22 is a diamond film or layer 22 deposited to a thickness of 100 to 1000 A using chemically vapor deposition. The layer 20 of dielectric and the layer 22 of diamond, or sapphire, together form a composite dielectric layer 24, as indicated. The thermal conductivity of diamond is around 1000 W/m°K. Thus, the thermal conductivity of layer 22 is at least two orders, here three orders, of magnitude greater than the thermal conductivity of layer 20.

Next, a photoresist layer 26 is deposited over the diamond layer 22 and patterned, as shown, with windows 28 using conventional photolithography. The patterned photoresist layer 26 windows 28 are in registration with the one or more of the metal conductors 18 patterned into the first metalization layer 12 (FIG. 1A). The windows 28 thus expose upper surface portions 30 of the diamond layer 22, as indicated in FIG. 1B. The exposed portions 30 of the diamond layer 22 are etched using reactive ion etch having a chemistry which includes fluorine. The removed portions of the diamond layer 22 thus expose underlying portions of the dielectric layer 20. Using the patterned photoresist layer 26 and the patterned diamond layer 22 as etching masks, the underlying exposed portions of the dielectric layer 20 are removed, here for example using fluorine reactive ion etching to thereby expose upper surface portions of one, or more, of the metal conductors 18 patterned in the first metalization layer 12. Thus, referring to FIG. 1B, vias 28 are formed through portions of the composite dielectric layer 24 to expose upper surface portions 33 of selected one or ones of the metal conductors 18 patterned in the first metalization layer 12. Next, the patterned photoresist layer 26 (FIG. 1C) is removed.

Figure 1D:
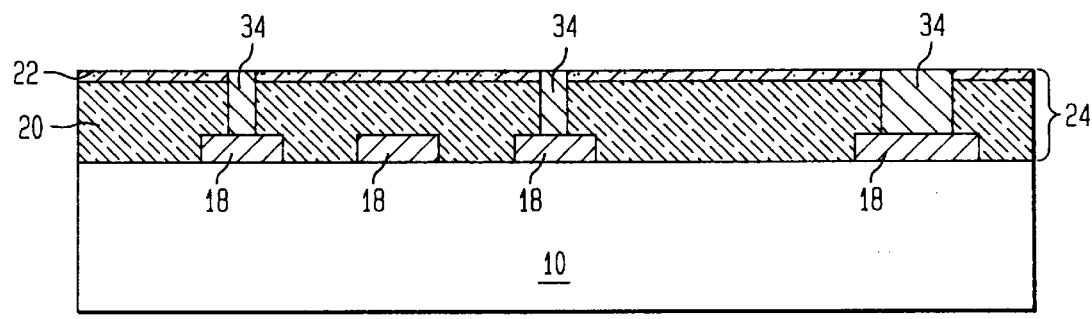
Figure 1E:
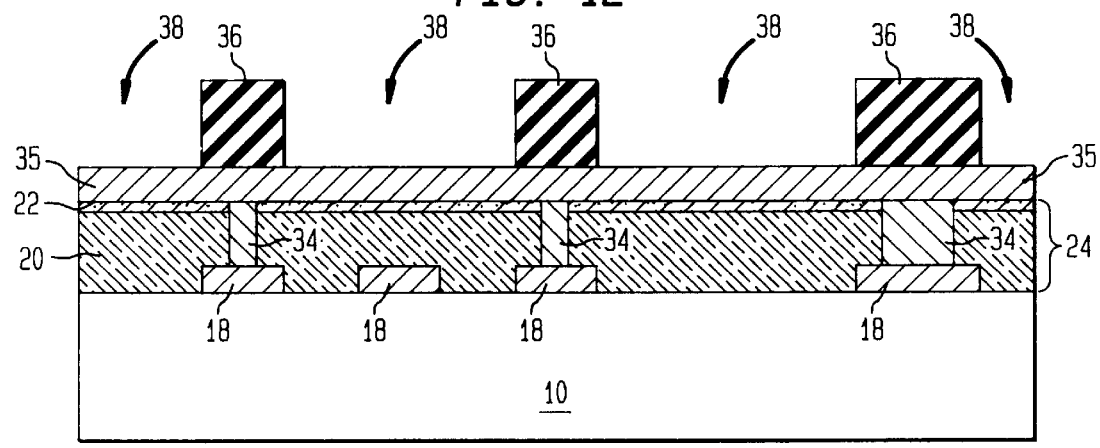
Figure 1F:
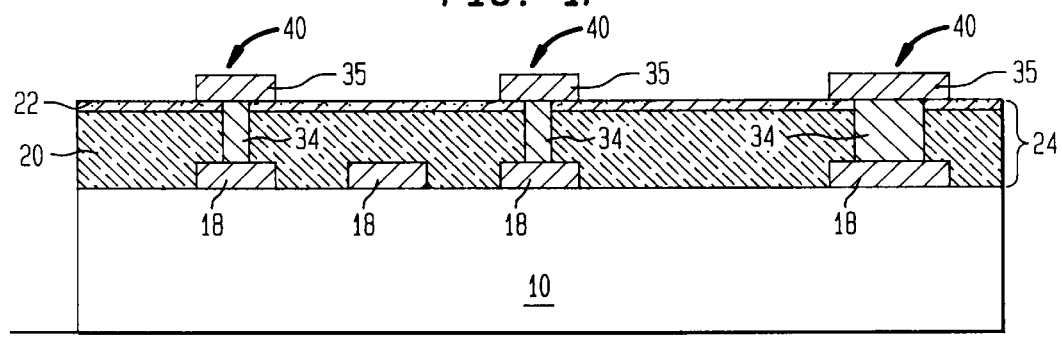

After the patterned photoresist layer 26 is removed, a metal 34, here tungsten, (FIG. 1C) is deposited over the upper surface of the diamond layer 32 and through the vias 32 (FIG. 1C) onto exposed upper surface portions of the conductors 18. Next, upper portions of the deposited tungsten layer 34 is polished down to the upper surface of the diamond layer 22 using chemical mechanical polishing (CMP). It is noted that the diamond layer 22 acts as a CMP stop. Thus, tungsten plugs 34 are formed as shown in FIG. 1D. Next, a layer of metal 35, here titanium, titanium nitride, aluminum, titanium, titanium nitride layers is deposited over the upper surface of the structure shown in FIG. 1D, as shown in FIG. 1E. Next, a patterned photoresist layer 36 is formed on the upper surface of the metal layer 35, as shown in FIG. 1E, with the patterned photoresist layer 36 being in registration with the vias 32 (FIG. 1C) formed through the composite dielectric layer 24. The upper surface of the structure thus formed is exposed to a chlorine reactive ion etching (RIE) process to remove the portions of the metal layer 35 exposed by windows 38 in the patterned photoresist layer 36. Thus, a conductor made up of the tungsten plugs 34 and metal layer 35 form a second metalization layer which is patterned into a second level of metal conductors 40, as shown in FIG. 1F. The photoresist layer 36 (FIG. 1E) is removed leaving the structure shown in FIG. 1F. It is noted that the diamond layer 22 serves as a hard, etch stop, mask protecting the underlying dielectric layer 20 during the RIE process.

Figure 1G:
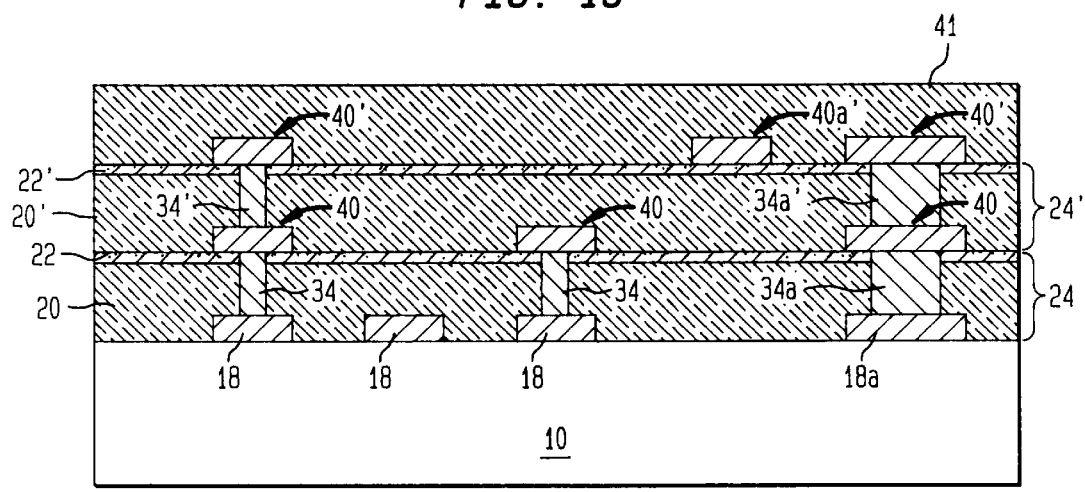

The above described process as described is repeated, an exemplary final structure being shown in FIG. 1G. It is noted that the final exemplary structure is an multi-level integrated circuit metalization system having a pair of composite dielectric layer 24, 24' each comprising a layer of diamond 22, 22' and a corresponding dielectric layer 20, 20' as shown. Each diamond layer 22, 22' has disposed on a surface thereof one of the patterned metalization layers, i.e., the conductors 40 patterned in the metalization layer 35 (FIG. 1E) and the conductors 40' patterned in a third metal disposed over diamond layer 22'. Conductive vias 34, 34' pass through the composite layers 24, 24' respectively, as shown. One end, i.e., the upper end, of the conductive vias 34. 34' is in contact with the diamond layers 22, 22' respectively, as shown. With such an arrangement, the diamond layers 22, 22' conducts heat laterally along from the composite dielectric layer 24, 24' respectively to a heat sink provided by the conductive via 34'a, 34a. Thus, heat is coupled to the substrate 10 by conductor 18a. It should be noted that absent the lateral heat transfer provided by the diamond layer 22', conductor 40'a is not proximate to a via and heat generated therein may have to pass vertically through the dielectric layer to the substrate. Such path may not provide adequate dissipation in the heat generated in conductor 40'a. Finally, it should be noted that the width of conductive vias 34a, 34'a may be wider than the width on vias used for electrical inter-level connection. The conductive vias 34a, 34'a here are used to provide a heat sink, or heat conduit to the substrate 10. A passivation layer 41 may be deposited over the structure.

Figure 2A:
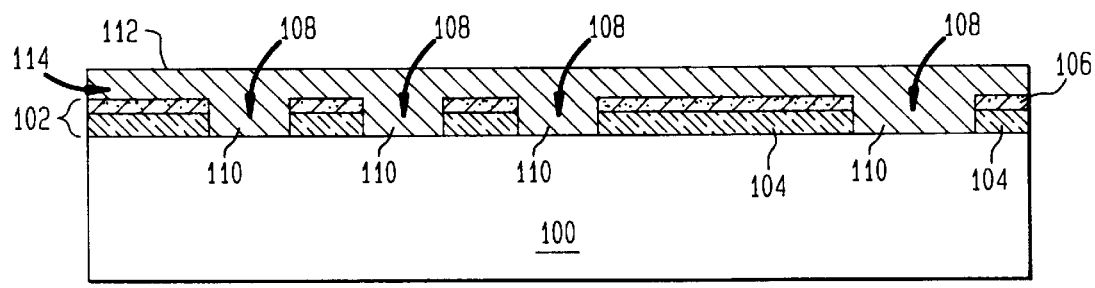
FIGS. 2A through 2C show an alternative metalization system for an integrated circuit at various stages in the manufacture thereof in accordance with the invention.
Figure 2B:
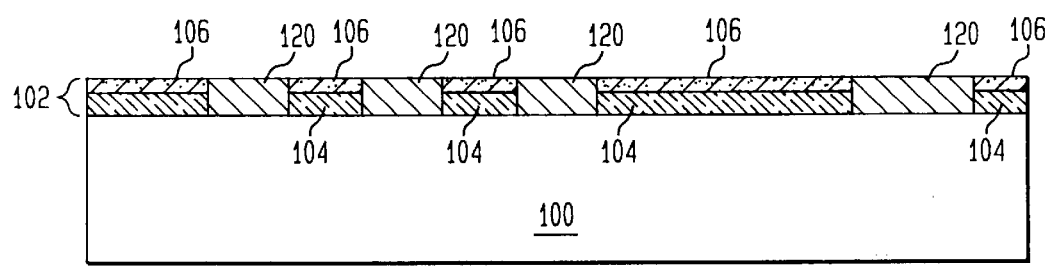

Referring now to FIG. 2A, a semiconductor substrate, here silicon, 100 is shown having a composite dielectric layer 102 made up of a lower silicon dioxide dielectric layer 104, here the same as dielectric layer 20 described above in connection with FIGS. 1A through 1G and an upper, thinner diamond, or sapphire, layer, or film 106, here the same as the diamond film 22 described above in connection with FIGS. 1A–1G, disposed on the upper surface of the silicon dioxide dielectric layer 102, as shown. Windows 108 are patterned through portions of the diamond layer 106 and trenches 110 are formed over the vias in the underlying portions of the dielectric layer 104. The trenches 110 are patterned in the patterned described for a first metalization layer 112. More particularly, a first layer of metal 112 is deposited over the upper surface of the structure, portions of the first metalization layer 112 passing through the windows 108 formed through the diamond layer 106 and into the trenches 110 formed in the dielectric layer 104. It is noted the upper portions 114 of the first metalization layer 112 extend above the upper surface of the diamond layer 106, as shown. This upper portion 114 of the first metalization layer 112 is removed by chemical mechanical polishing so that the upper surface of the first metalization layer 114 is level with the upper surface of the diamond layer 106 as shown in FIG. 2B, thus patterning the first metalization layer 114 into dielectrically separated conductors 120, as shown in FIG. 2B. It is noted that the diamond layer 106 serves as a hard mask, here a polish stop, in patterning the first metalization layer 112.

Figure 2C:
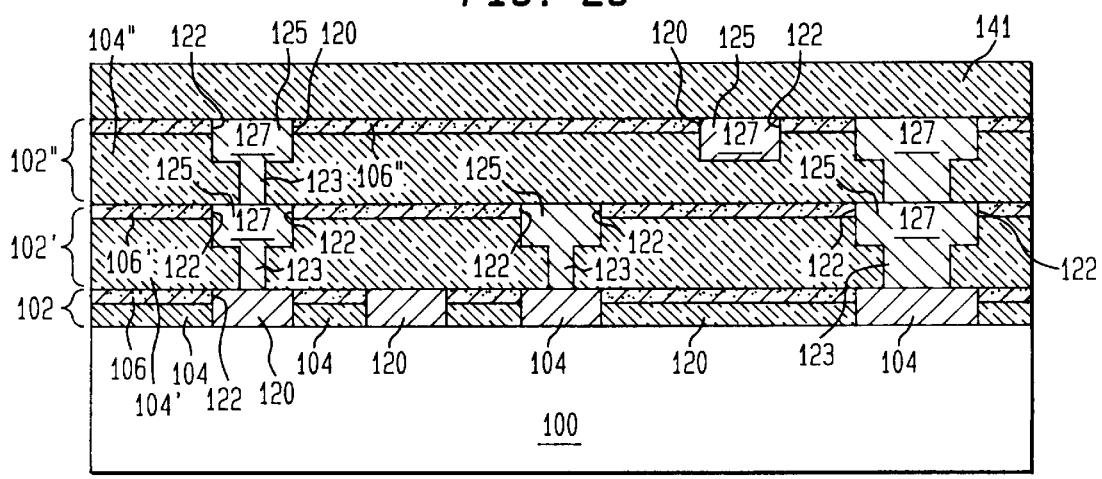

The above described process may be repeated to form as many levels of metal as desired. An exemplary final structure being shown in FIG. 2C. Here again, the final exemplary structure is an multi-level integrated circuit metalization system having three composite dielectric layers 102, 102', and 102" each comprising a layer of diamond 106, 106', 106" and a dielectric layer 104, 104', 104" respectively as shown. The diamond layers 106, 106', and 106" have disposed on an edge surface 122 thereof one of the patterned metalization layers. Via holes 123 are first formed through the composite layers 102, 102', 102" as with the structure shown and described above in connection with FIG. 1G using first photolithographic/chemical etching steps. Here, however, wider trenches 125 are formed in the upper portions of dielectric layers 102', 102" over, and in registration with the narrower via holes 123, as shown, using second photolithographic/chemical etching steps. Disposed in the via holes 123 and the trenches 125 is a conductive layer 127 here aluminum. It is noted that one end of the portion 122 of the aluminum layer 127 passing in the via hole 123 is in contact with a diamond layer 106, 106'. With such an arrangement, the diamond layer 106, 106' conducts heat laterally along from the metalization layer 127 disposed thereon to a heat sink provided by the conductive via 104. A passivation layer 141 may be deposited over the structure.

While the invention has been particularly shown and described with reference to various embodiments, it will be recognized by those skilled in the art that modifications and changes may be made to the present invention without departing from its scope. The scope of the invention should therefore be determined not with reference to the above description but with reference to the appended claims along with their full scope of equivalents.

What is claimed is:

1. An integrated circuit metalization system, comprising:
   a semiconductor substrate;
   a plurality of patterned metalization layers disposed over the substrate;
   a composite dielectric layer disposed between a pair of the metalization layers, such composite dielectric layer having a first dielectric layer and a second dielectric layer, the first dielectric layer having a thermal conductivity at least two orders of magnitude greater than the thermal conductivity of the second dielectric layer;
   wherein one of the patterned metalization layers is disposed on the first dielectric layer;
   a conductive via passing through the composite layer and in contact with the first dielectric layer;
   including an additional conductive via electrically interconnecting a pair of the plurality of metalization layers; and
   wherein the first layer is in thermal contact with the additional conductive via.

2. The system recited in claim 1 wherein the first dielectric layer is substantially thinner than the second dielectric layer.

3. The system recited in claims 2 wherein the second dielectric layer is at least five times thicker than the first dielectric layer.

4. The system recited in claim 2 wherein the first dielectric layer is diamond.

5. The system recited in claim 2 wherein the first dielectric layer is sapphire.

6. An integrated circuit metalization system, comprising:
   a semiconductor substrate;
   a plurality of patterned metalization layers disposed over the substrate;
   a composite dielectric layer disposed between a pair of the metalization layers, such composite dielectric layer having a first dielectric layer and a second dielectric layer, the first dielectric layer having a thermal conductivity at least two orders of magnitude greater than the thermal conductivity of the second dielectric layer;
   wherein one of the patterned metalization layer is disposed on the first dielectric layer;
   a conductive via passing through the composite layer and in contact with the first dielectric layer;
   an additional conductive via electrically interconnecting a pair of the plurality of metalization layers;
   wherein the first layer is in thermal contact with the additional conductive via; and
   wherein the additional via is wider than the first mentioned via.

7. An integrated circuit metalization system, comprising:
   a semiconductor substrate;

a plurality of patterned metalization layers disposed over the substrate;

a composite dielectric layer disposed between a pair of adjacent ones of the metalization layers, such composite dielectric layer having a first dielectric layer and a second dielectric layer, the first dielectric layer having a thermal conductivity at least two orders of magnitude greater than the thermal conductivity of the second dielectric layer;

wherein portions of such metalization layers being disposed in openings passing through the first dielectric layer into trenches disposed in underlying portions of the second dielectric layer, such portions of the metalization layer having surface portions terminating along an upper surface of the first dielectric layer and having upper side portions disposed in contact with edge portions of the second dielectric layer providing the openings therein.

8. The metalization system recited in claim 7 including a conductive via passing through the composite layer and in contact with the first dielectric layer.

9. The metalization system recited in claim 7 including an additional conductive via electrically interconnecting a pair of the plurality of metalization layers; and wherein the first layer is in thermal contact with the additional conductive via.

10. The system recited in claim 7 wherein the first dielectric layer is substantially thinner than the second dielectric layer.

11. The system recited in claim 10 wherein the second dielectric layer is at least five times thicker than the first dielectric layer.

12. The system recited in claim 10 wherein the first dielectric layer is diamond.

13. The system recited in claim 12 wherein the first dielectric layer is sapphire.

14. The system recited in claim 9 wherein the additional via is wider than the first mentioned via.

* * * * *